United States Patent
Hong

(10) Patent No.: US 6,548,346 B1
(45) Date of Patent: Apr. 15, 2003

(54) PROCESS FOR FORMING DRAM CELL

(75) Inventor: Gary Hong, Hsin-Chu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 08/888,781

(22) Filed: Jul. 7, 1997

Related U.S. Application Data

(60) Provisional application No. 60/043,052, filed on Apr. 4, 1997.

(51) Int. Cl.[7] .............................................. H01L 21/8242
(52) U.S. Cl. ........................................ 438/253; 438/255
(58) Field of Search ................................ 438/253–256, 438/396–398

(56) References Cited

U.S. PATENT DOCUMENTS 5,330,614 A * 7/1994 Ahn
5,358,888 A * 10/1994 Ahn et al.
5,447,878 A * 9/1995 Park et al.

* cited by examiner

Primary Examiner—Jey Tsai

(57) ABSTRACT

A transfer FET of a DRAM cell is formed having protective dielectric layers on the top and sides of the gate electrode. A first dielectric layer, preferably silicon dioxide, is provided over the transfer FET and a self-aligned etching process is used to etch through the first dielectric layer and to open a contact via to expose one of the source/drain regions of the transfer FET. A thick layer of polysilicon is deposited over the access circuitry and in contact with the exposed source/drain region of the transfer FET. A second dielectric layer is deposited over the surface of the thick layer of polysilicon and patterned to define a sacrificial structure on the polysilicon layer and over the one source/drain region. A third dielectric layer is deposited over the sacrificial structure and is anisotropically etched back to form sidewall spacer structures on the surface of the polysilicon layer. The sacrificial structure is removed and the spacer structures are used as a mask for shaping the thick polysilicon layer into at least part of a bottom capacitor electrode. The spacers are removed and a layer of hemispherical grained polysilicon (HSG-Si) is deposited over the surface of the etched thick polysilicon layer and etched back to transfer the textured surface of the HSG-Si to the underlying conventional polysilicon. A bottom capacitor electrode mask is used to define the lateral extent of the bottom capacitor electrode. The first dielectric layer acts as an etch stop in this process. A capacitor dielectric and a top capacitor electrode are provided to complete the DRAM cell capacitor and further processing continues to complete the DRAM.

19 Claims, 3 Drawing Sheets

PROCESS FOR FORMING DRAM CELL

This application claims priority from provisional application Ser. No. 60/043,052, filed Apr. 4, 1997.

BACKGROUND OF THE INVENTION

1. Field of the Invention

The present invention relates to the formation of capacitors for integrated circuit memories and particularly to methods of forming high capacitance structures in a high production manufacturing environment.

2. Description of the Related Art

In dynamic random access memories (DRAMs), information is typically stored by selectively charging or discharging each capacitor of an array of capacitors formed on the surface of a semiconductor substrate. Most often, a single bit of binary information is stored at each capacitor by associating a discharged capacitor state with a logical zero and a charged capacitor state with a logical one. The surface area of the electrodes of the memory capacitors determines the amount of charge that can be stored on each of the capacitors for a given operating voltage, for the electrode separation that can reliably be manufactured, and for the dielectric constant of the capacitor dielectric used between the electrodes of the charge storage capacitor. Read and write operations are performed in the memory by selectively coupling the charge storage capacitor to a bit line to either transfer charge to or from the charge storage capacitor. The selective coupling of the charge storage capacitor to the bit line is typically accomplished using a transfer field effect transistor (FET). The bit line contact is typically made to one of the source/drain electrodes of the transfer FET and the charge storage capacitor is typically formed in contact with the other of the source/drain electrodes of the transfer FET. Word line signals are supplied to the gate of the FET to connect one electrode of the charge storage capacitor through the transfer FET to the bit line contact facilitating the transfer of charge between the charge storage capacitor and the bit line.

There is a continuing trend toward increasing the storage density of integrated circuit memories to provide increased quantities of data storage on a single chip. Higher density memories provide storage that is generally more compact and is often cheaper on a per bit basis than an equivalent amount of storage provided on plural chips. It has generally been possible to provide these higher levels of storage at equivalent or improved levels of performance as compared to the earlier, less dense memory chips. Historically, the density of integrated circuit devices has been increased in part by decreasing the size of structures such as wiring lines and transistor gates as well as by decreasing the separation between the structures that make up the integrated circuit device. Reducing the size of circuit structures is generally referred to as decreasing the "design rules" used for the manufacture of the integrated circuit device.

Applying reduced design rules to a DRAM reduces the substrate surface area that can be devoted to the charge storage capacitor of the DRAM. Thus, applying reduced design rules to conventional planar capacitor designs reduces the amount of charge (i.e., capacitance) that can be stored on the charge storage capacitor. Reducing the amount of charge on the capacitor leads to a variety of problems, including the potential loss of data due to greater susceptibility to decay mechanisms and to charge leakage. This greater susceptibility to charge loss may cause the DRAM to require more frequent refresh cycles, which are undesirable since the memory may be unavailable for data storage and readout transactions during refresh activities. In addition, reduced levels of charge storage might require more sophisticated data readout schemes or more sensitive charge sensing amplifiers. Thus, modem DRAMs require increased levels of capacitance in reduced substrate area DRAM cells. To this end, a variety of very complex capacitor structures having three dimensional charge storage surfaces have been proposed. In general, these complex capacitor structures are difficult to manufacture. This is particularly true when the requirements are taken into account for forming such capacitor structures in a high throughput manufacturing environment in a manner compatible with high yields. It is accordingly an object of the present invention to provide a capacitor structure that is more compatible with a high volume manufacturing environment.

SUMMARY OF THE PREFERRED EMBODIMENTS

According to one aspect, the present invention forms a DRAM including charge storage capacitors on a substrate having charge storage capacitor access circuitry such as transfer transistors formed thereon. The method of forming a DRAM includes forming a transfer transistor including a gate electrode and first and second source/drain regions on a substrate and opening a contact via to expose at least a portion of the first source/drain region. A first polysilicon layer is deposited over the contact via and then a sacrificial layer is provided over the first polysilicon layer which is patterned to form a sacrificial structure having sidewalls. Spacers are formed on the sidewalls of the sacrificial structure and the sacrificial structure is removed. In a first etching process, the first polysilicon layer is etched using the spacers as a mask in an anisotropic etching process to form a vertically extending structure electrically connected to the first source/drain region.

DETAILED DESCRIPTION OF THE PREFERRED EMBODIMENTS

Figure 1:
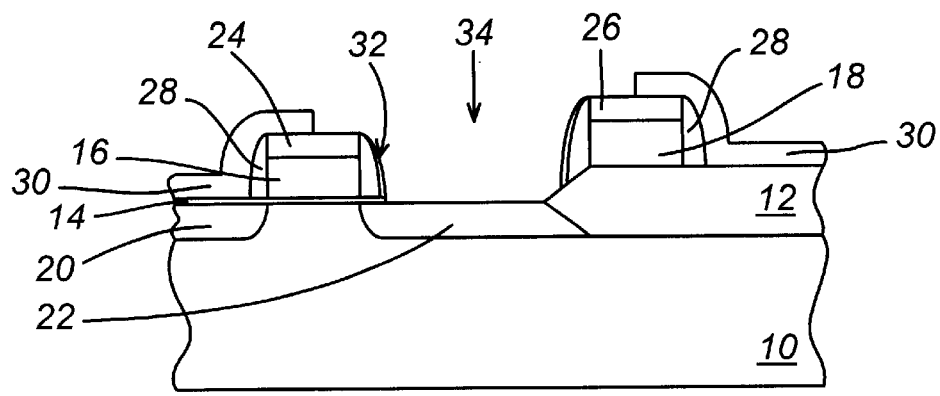
FIGS. 1–7 illustrate steps in the manufacture of a DRAM in accordance with preferred aspects of the present invention.

Preferred embodiments of the present invention provide a high capacitance DRAM capacitor using methods compatible with high volume manufacture. In accordance with a particularly preferred embodiment of the present invention, a transfer FET is formed for the DRAM cell in and on a substrate along with the wiring lines and other portions of the access circuitry for the DRAM cell. Preferably, the gate electrodes and wiring lines of the access circuitry are covered by protective dielectric layers. A first dielectric layer, preferably silicon dioxide, is provided over the transfer FET and a self-aligned etching process is used to etch through the first dielectric layer to open a contact via exposing one of the source/drain regions of the transfer FET. A thick layer of polysilicon is deposited over the access circuitry and in contact with the one source/drain region of the transfer FET. A second dielectric layer is deposited over the surface of the thick layer of polysilicon and patterned to define a sacrificial structure on the polysilicon layer and over the one source/drain region. A third dielectric layer is deposited over the sacrificial structure and is anisotropically etched back to form sidewall spacer structures on the surface of the polysilicon layer. The sacrificial structure is removed and the spacer structures are used as a mask for shaping the thick polysilicon layer into at least part of a bottom capacitor electrode.

In a particularly preferred aspect of the present invention, the spacer structures are used as a mask in an anisotropic etching process to etch partially through the thick polysilicon layer. The spacers are removed and a layer of hemispherical grained polysilicon (HSG-Si) is deposited over the surface of the etched thick polysilicon layer. Most preferably, the HSG-Si is then etched to remove the hemispherical grained polysilicon in a manner that transfers the textured surface of the HSG-Si to the underlying conventional polysilicon. This etching process is preferably continued to remove sufficient of the remaining portions of the thick polysilicon layer to define the bottom electrode patterns. The first dielectric layer acts as an etch stop in this process. A capacitor dielectric and a top capacitor electrode are provided to complete the DRAM cell capacitor and further processing continues to complete the DRAM.

Manufacture of a DRAM in this manner provides a device that has a high level of capacitance using a comparatively simple process. Features are provided on the DRAM capacitor that are smaller than the photolithography resolution limit in two different ways. First, the vertically extending portions of the bottom electrode are formed in an etching process that uses a mask made up of sidewall spacer structures. These spacer structures are formed in a process that is independent of the particular photolithography process and equipment used so that the spacers typically have a width approximately equal to the thickness of the layer from which the spacers are formed. The width of these spacer structures is thus set to something less than the photolithography resolution limit. Secondly, a layer of hemispherical grained polysilicon, which can have feature sizes on the order of approximately 100 nanometers, is deposited and etched back to produce a more rugged surface on the bottom electrode. The surface texture provided to the bottom capacitor electrode in this way has a dimension much smaller than present resolution limits. The processes used in these steps are well understood and have high yields. As such, it is to be expected that DRAM's formed in accordance with this process can be manufactured with comparatively high yields. Further discussion of these aspects and other preferred aspects of the present invention is now presented with specific reference to FIGS. 1–7.

Formation of a dynamic random access memory (DRAM) in accordance with preferred embodiments of the present invention begins on a P-type silicon substrate 10. FIG. 1 illustrates a substrate 10 having device isolation structures 12 formed on its surface and with a gate oxide layer 14 covering the active device regions of the substrate. The device illustrated in FIG. 1 incorporates field oxide regions formed by the local oxidation of silicon (LOCOS) technique. Other types of device isolation regions might alternately be provided including, for example, shallow trench isolation regions filled with CVD oxide. Transfer FETs are formed on the active device region in the conventional fashion. Typically, a polysilicon layer is deposited over the substrate and patterned to define polysilicon gate electrodes 16 and wiring lines 18. The polysilicon may be doped either in situ during deposition or by ion implantation of the blanket deposited polysilicon layer before patterning or at some later point in processing. N-type source/drain regions are 20, 22 provided in the substrate 10 on either side of gate electrode 16. In some embodiments, it may be preferred to provide a lightly doped drain (LDD) structure for each of the source/drain regions 20, 22 illustrated in FIG. 1. Presently, however, it is more desirable to provide a uniformly doped N-type region for each of the source/drain regions 20, 22.

It is typically preferred to provide protective dielectric layers around the gate electrode 16 and the wiring line 18 to protect these conductors during subsequent processing and to reduce the possibility of undesired contacts being formed to the conductors 16, 18. Consequently, it is typical to provide oxide layers 24, 26 over the gate electrode 16 and wiring line 18, respectively. Typically, these oxide layers are provided over the blanket deposited polysilicon layer prior to the patterning steps used to define the gate electrode 16 and wiring line 18. Alternately, silicon nitride or an oxynitride might be provided as a capping, protective dielectric layer over the gate electrode. Alternative materials are particularly useful for processes which benefit from forming consecutive, dielectric layers from different materials in a manner that one layer can be used as an etch stop layer for etching an overlying layer. It is also desirable to form protective dielectric layers on the sides of gate electrode 16 and wiring line 18. In some cases oxide spacer structures 28 are formed on the sides of gate electrode 16 and wiring line 18 in the process of forming a lightly doped drain (LDD) structure for the source/drain regions of the transfer FET. In those embodiments where an LDD structure is formed for the source/drain regions, the oxide spacer structures are typically left in place during subsequent processing. In those presently preferred embodiments of the present invention in which a constant doping is at least initially provided to the source/drain regions 20, 22, oxide spacer structures 28 are preferably formed alongside the gate electrode 16 and wiring line 18 to protect those conductors and to prevent shorts later in processing. Oxide spacer structures 28 may be formed by providing a blanket oxide layer by chemical vapor deposition (CVD) to a thickness approximately equal to the width desired for the oxide spacer structures 28. An anisotropic etchback process using, for example, an etchant derived from a plasma'source incorporating a $CF_4$ or other fluorine bearing species may be used to form the illustrate oxide spacer structures 28.

After the transfer FET and wiring lines are defined, a first dielectric layer 30 is deposited over the transfer FET and wiring lines. Dielectric layer 30 is preferably formed of a material that can be used as an etch stop for a polysilicon etching process. In some embodiments particularly suited for aggressive design rules, the material of the first dielectric layer 30 might be selected so that it can be selectively etched without etching the protective dielectric structures 24, 26 and 28 formed around the gate electrode 16 and wiring line 18. For such an embodiment, some or all of the protective dielectric structures might be silicon nitride while dielectric layer 30 is silicon oxide. However, for most high volume manufacturing processes, selective etching of the dielectric layers will not be necessary so the first dielectric layer 30 maybe selected to be the same as the materials used in the protective dielectric structures 24, 26 and 28. For these more typical manufacturing processes, it will be sufficient to use similar dielectric materials and to design an appropriate etching process, including providing sufficient thicknesses of dielectric layers to facilitate fixed time etching processes. The particular etching strategy used to define the end point of subsequent etching steps will determine how thick the first dielectric layer 30 should be. Generally, the layer 30 need only be sufficiently thick to act as a reliable etch stop for a polysilicon etching process. If there is a danger of other etching processes reducing the thickness of layer 30 to such an extent that layer 30 might not serve as a reliable etch stop to the polysilicon etching steps that follow, then a thicker first dielectric layer 30 should be provided. After the first dielectric layer is provided over the transfer FET and wiring lines, a contact definition mask is provided over the first dielectric layer 30. Typically, this mask will be formed from photoresist using conventional photolithography techniques. The contact definition mask is used to remove a portion of the first dielectric layer 30 to expose at least a portion of the source/drain region 22 on which a part of the bottom electrode of the DRAM capacitor is to be formed. If the first dielectric layer 30 is silicon oxide, an appropriate etching process might include reactive ion etching (RIE) using ions derived from a $CF_4$ plasma. In this process, it is typical to form a second spacer structure 32 alongside the portions of the spacer structures 28 that are exposed within the contact via. The photoresist maskis then removed to form the structure illustrated in FIG. 1. The mask used for etching the first dielectric layer 30 need not be aligned with great precision because the dielectric structures protecting the gate electrode 16 and wiring line 18 allow the etching process to form a self-aligned via to the source/drain region 22. Thus, if sufficient thicknesses are provided for the various protective dielectric structures or if appropriate materials are used to allow selective etching, the contact via can be formed with great process latitude, including a non-critical mask alignment.

Figure 2:
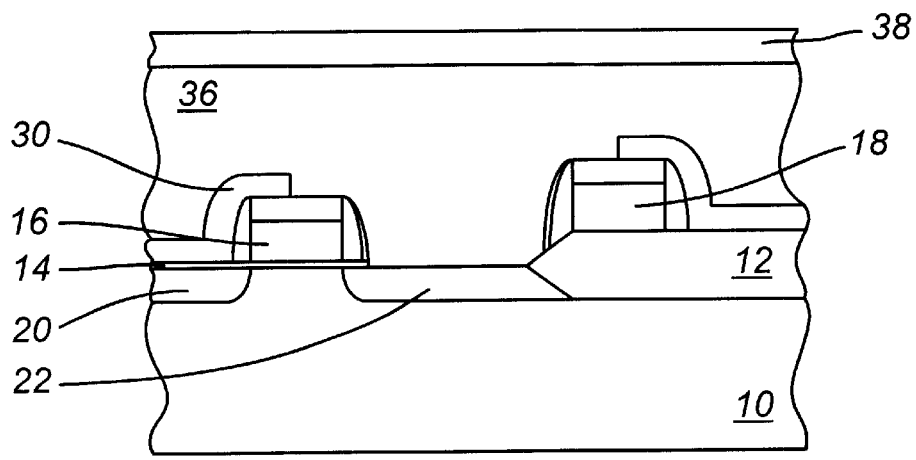
Figure 3:
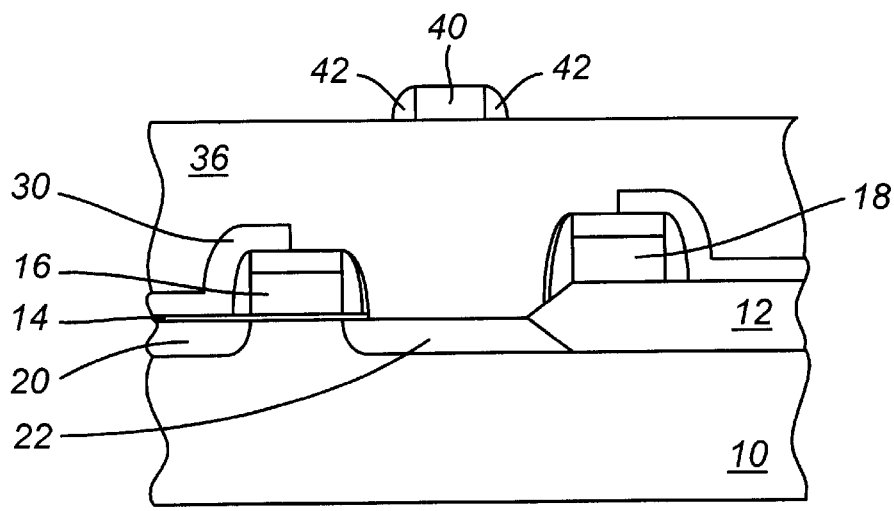
Figure 4:
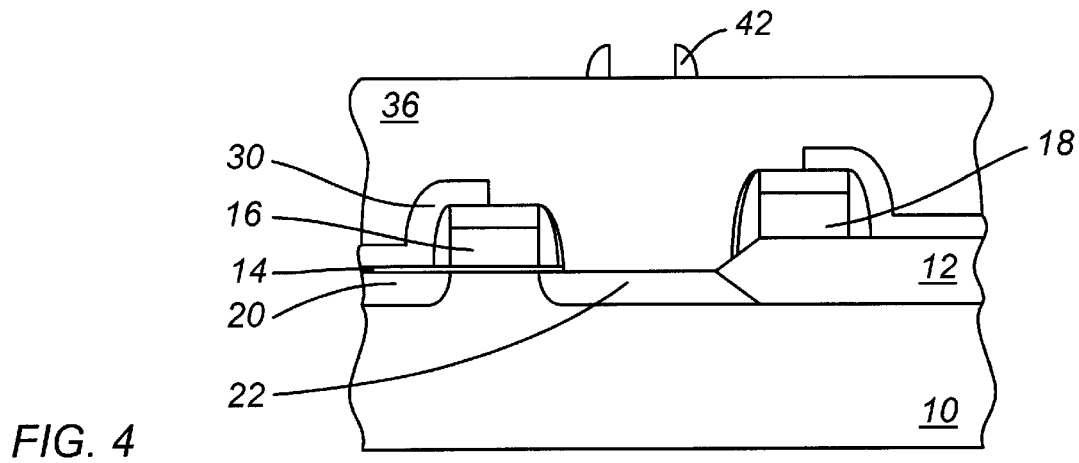

Next, a thick layer of polysilicon is deposited over the FIG. 1 structure forming the structure shown in FIG. 2. This polysilicon layer 36 may be deposited using a low pressure chemical vapor deposition (LPCVD) process, as is conventional. It may be desirable to planarize the surface of polysilicon layer 36 using, for example, chemical mechanical polishing. Polysilicon layer 36 is preferably thick, for example 4,000–8,000 Å in thickness, because the height of the upper surface of the polysilicon layer 36 above the substrate 10 will, in part, determine the capacitance of the DRAM capacitor formed according to the present invention. Polysilicon layer 36 may be doped in situ during deposition through the addition of phosphine or arsine gas to the deposition environment. Preferably, the polysilicon layer 36 is highly doped during deposition so that it will not need further doping for use in the bottom electrode of the DRAM capacitor. By doping the polysilicon layer 36 in situ, there is comparatively less likelihood of excessive diffusion from the bottom capacitor electrode into the source/drain region 22. Such excessive diffusion is undesirable because it reduces the reliability of the DRAM capacitor by increasing leakage through the transfer FET.

Methods in accordance with the present invention proceed to define an etching mask for shaping the polysilicon layer 36 into a portion of the bottom electrode for a charge storage capacitor. To facilitate the following discussion and to better explain the strategy incorporated within the present invention, the specification provides a description of a specific process for forming the mask, and identifies the particular advantages of making the choices represented in this specific embodiment. It should nevertheless be appreciated that other specific embodiments representing a similar strategy may be used in accordance with the teachings of the present invention.

Still referring to FIG. 2, a second dielectric layer 38 of, for example, silicon nitride is deposited over the surface of the polysilicon layer 36 that will be patterned to form a sacrificial structure used in forming a polysilicon etch mask. The silicon nitride layer 38 may be deposited by CVD to a thickness of 500–2,000 Å. The thickness of the silicon nitride layer 38 determines the thickness of the mask to be used for shaping the polysilicon layer 36 into a bottom capacitor electrode. Accordingly, the thickness of the silicon nitride layer chosen should be sufficient to accommodate whatever erosion might occur in the process of etching the polysilicon layer 36 using the mask to be formed. The silicon nitride layer 38 is then patterned to define a sacrificial structure 40 (FIG. 3) used to define the spacing between different parts of the mask to be formed. Generally, the silicon nitride sacrificial structure 40 will be a rectangular or circular island lying over a single DRAM cell. The width of the sacrificial silicon nitride structure 40 can be selected to be the photolithography resolution limit or, if the cell design permits, something greater.

A third layer of dielectric material is blanket deposited over the sacrificial silicon nitride structure 40. Preferably, the material chosen for the third dielectric layer is one which can be selectively etched without significantly etching the material of the sacrificial silicon nitride structure 40. Most preferably, the third dielectric layer is formed from silicon oxide which has the particular advantage that it can be selectively etched by both dry etching and wet etching techniques without particularly etching silicon nitride. An RIE etchback process is then used to define the spacer structures 42 that make up the polysilicon etch mask. While this etching step need not be performed with a high level of selectivity, it is preferred that the etchant system be derived by plasma from one or more source gases such as $SF_6$ or $C_2F_6$ mixed with different quantities of other gases such as HBr and He to achieve at least a moderate level of selectivity in the etching process to provide increased process margins. The width of the spacer structures 42 will be approximately equal to the thickness of the third dielectric layer deposited. As such, it is preferred that the thickness of the third dielectric layer deposited be sufficient to provide spacer structures 42 of sufficient width to accommodate any erosion inherent to the polysilicon etching process. This width will typically be thinner than the lithography resolution limit because of the spacer etchback process used to form the structures 42. For example, a silicon oxide third dielectric layer may be approximately 500–3000 Å in thickness. As such, the resulting bottom capacitor electrode will have feature sizes smaller than the lithography resolution limit and so will have greater capacitance than might be obtained using conventional lithography processes. Next, the FIG. 3 structure is dipped in a hot phosphoric acid solution to remove the sacrificial nitride structure 40, producing the structure illustrated in FIG. 4.

Figure 5:
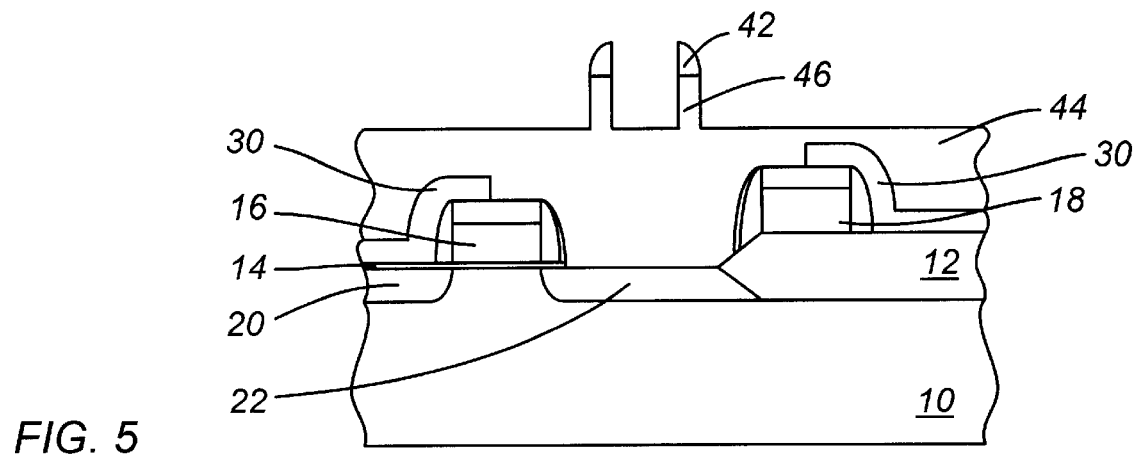

The oxide spacer structures are then used as a mask for etching polysilicon layer 36. At least a portion of the polysilicon layer 36 is etched using the oxide spacer structures 42 as a mask for an RIE process using HCl and HBr as source gases. The etching process can be continued to extend to the first dielectric layer 30 so that, to a large extent, the portion of the polysilicon layer 36 that remains after this etching process are the vertical structures beneath the spacer etch mask 42. Alternately, the etching process can be continued only partially through the polysilicon layer to leave behind a polysilicon layer 44 over the substrate, with polysilicon structures 46 extending above the polysilicon layer 44 and beneath the spacer etch mask 42 as shown in FIG. 5. The embodiment illustrated in FIG. 5 is presently preferred because it provides a more planar structure that facilitates further processing than an etch process that proceeds entirely through the polysilicon layer. Because it is preferred that hemispherical grained polysilicon be provided over the surface of the bottom electrode and subsequently etched, such further processing is performed in many preferred embodiments of the present invention.

It will be appreciated that, in the preferred embodiments of the invention, the vertically extending polysilicon structures will have the shape of tubes having circular, rectangular or other cross sections. The oxide spacer etching mask 42 is then removed, preferably in a dilute hydrofluoric acid solution, to leave the partially defined polysilicon lower electrode 44, 46. A first layer of hemispherical grained polysilicon (HSG-Si) is then deposited over this shaped conventional polysilicon structure 44, 46. It is preferred that the HSG-Si growth process be initiated on a clean silicon surface by cleaning native oxide from the surface of the polysilicon layer 40 before depositing the HSG-Si. A distinct cleaning step may be unnecessary if the growth of the HSG-Si layer is initiated immediately after etching exposes the underlying layer of polysilicon, if the surface of the underlying polysilicon layer is maintained in a sufficient vacuum to prevent oxide growth. More practically, it is to be expected that there will be a time interval between the etching of the underlying polysilicon layer and the initiation of HSG-Si growth. Accordingly, the surface of the underlying polysilicon layer is preferably cleaned before the initiation of HSG-Si growth. Native oxides may be cleaned from the surface of polysilicon by a variety of techniques, including HF dip, spin-etching using HF, vapor HF cleaning, or by an $H_2$ plasma cleaning. Preferably, the surface of the underlying polysilicon layer is hydrogenated as a result of the cleaning operation, because the hydrogenated surface serves to protect the polysilicon surface from reoxidation. Each of the cleaning techniques listed above will achieve the desired hydrogenation of the polysilicon surface.

After cleaning, a layer of HSG-Si is formed on the surface of the shaped conventional polysilicon structure 44, 46. The layer may be formed in any of the well-known methods and may consist of depositing HSG-Si by LPCVD from silane source gas onto a substrate held at a temperature of between 555° C. to 595° C. The resulting structure includes an irregular surface of HSG-Si due to the largely random nature of the nucleation of HSG-Si growth. Growth of a layer of HSG-Si on the surface of conventional polysilicon has been observed to provide distinct grains having sizes on the order of 100 nanometers or smaller. When incorporated within DRAM capacitors, such HSG-Si layers have been observed to increase capacitance by approximately a factor of 1.8 times over the capacitance provided by the smooth surface of the conventional polysilicon layer. The surface of the HSG-Si may, however, not be entirely desirable for the surface of DRAM capacitor electrode to provide the desired performance and reliability for the resulting DRAM. As such, it is preferred that the HSG-Si layer actually be removed from the surface of the shaped conventional polysilicon structure 44, 46 in a fashion that transfers the rugged, textured surface of the HSG-Si layer to the conventional polysilicon structure. This is readily accomplished using a substantially isotropic etching process such as plasma etching using HCl as a source gas. Notably, the first dielectric layer 30 acts as an etch stop if this process extends completely through portions of the shaped conventional polysilicon layer, as is preferred.

Figure 6:
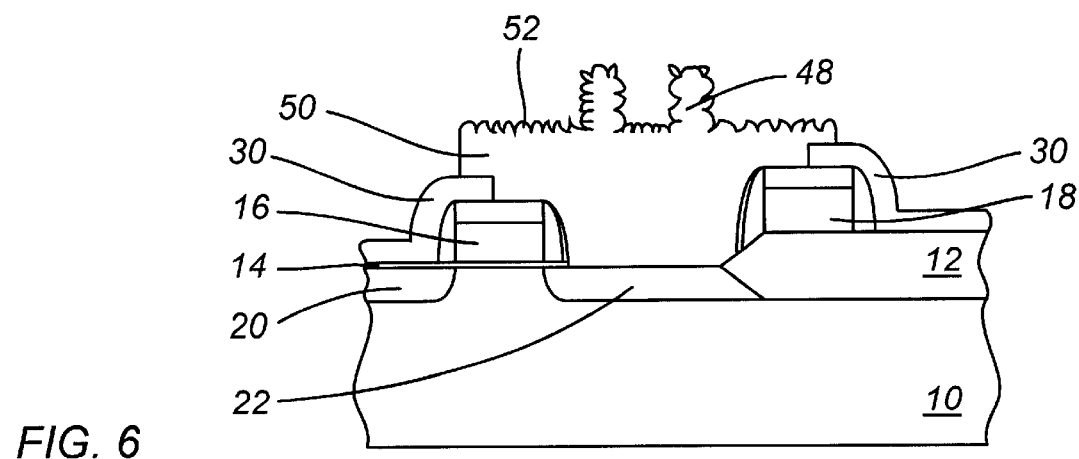
Figure 7:
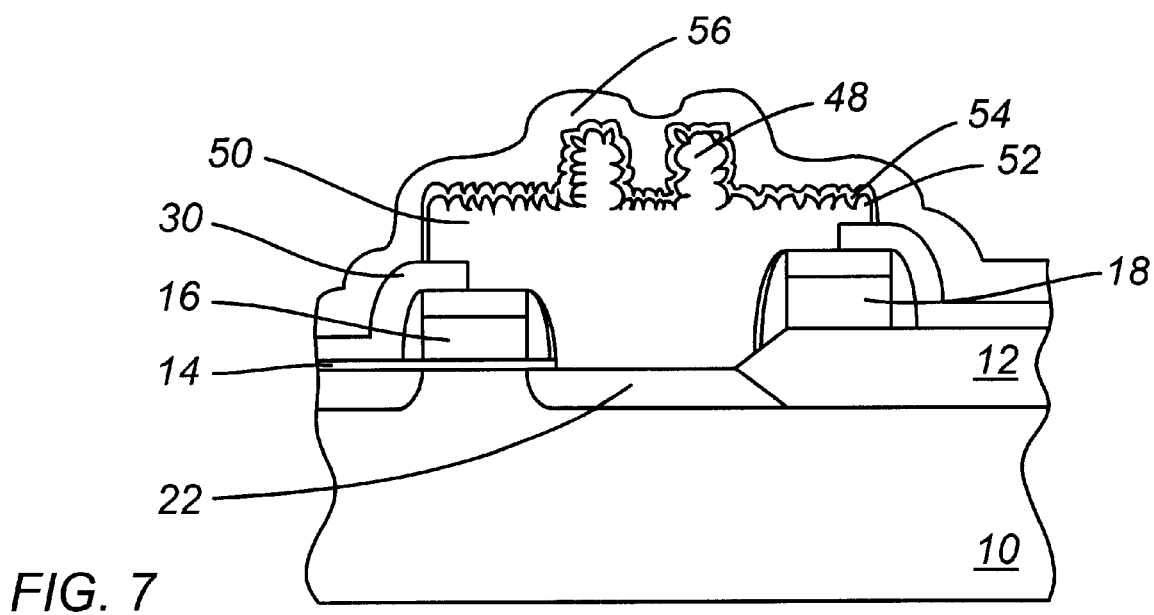

This HSG-Si etchback process produces the structure illustrated in FIG. 6, with vertically extending (tube-like) structures 48 extending above a lower polysilicon portion 50 and having a surface texture 52 similar to that of HSG-Si. Depending on the particular device geometries chosen, it is preferred that this etching step could be continued to complete the lateral definition of the bottom capacitor electrode. Such a process reduces the number of processing steps required for forming the DRAM capacitor. In this regard, it is important to note that the structure illustrated in FIG. 6 is highly schematic. Typically, the HSG-Si surface texture transferred to the surfaces of conventional polysilicon structures 48, 50 will not be on the illustrated scale, and the remaining heights illustrated for the shaped polysilicon layer 50 above the first dielectric layer 30 will be smaller. As such, the preferred etching process can readily complete the structure schematically illustrated in FIG. 6. Alternately, a mask may be formed over the lower portions 50 of the conventional polysilicon structure followed by a polysilicon etching process to define the extent of the lower capacitor electrode. This alternative provides greater protection from stringers being left on the surface of the device after the bottom capacitor electrode is defined. For either strategy, the first dielectric layer 30 functions as an etch stop for defining the lateral extent of the DRAM capacitor lower electrode.

A capacitor dielectric layer 54 is then provided over the rugged surface of conventional apolysilicon structures 48, 50. Various capacitor dielectrics are known and include, for example, the multilayer oxide/nitride/oxide dielectric typically referred to as "ONO." Such a structure may be formed by allowing a native oxide layer to grow over the rugged polysilicon surface, depositing a thin layer of silicon nitride by chemical vapor deposition and then oxidizing a thin portion of the nitride surface in a thermal oxidation process to complete the ONO capacitor dielectric 54. More preferably, the lowest oxide layer of the ONO structure is suppressed to form an "NO" capacitor dielectric. Still more preferable is the use of a higher dielectric constant material such as $Ta_2O_5$ or one of the perovskite dielectrics such as barium strontium titanate. Next, an upper capacitor plate 56 is formed over the bottom capacitor electrodes by blanket LPCVD of polysilicon, preferably doped in situ during deposition or less preferably by ion implantation doping and annealing. The upper capacitor electrode is patterned and further processing is performed to complete the DRAM device.

While the present invention has been described in terms of certain preferred embodiments thereof, those of ordinary skill in the art will appreciate that various modifications might be made to the embodiments described herein without altering the fundamental teachings of the present invention. As such, the present invention is not to be limited to the particular specific embodiments described. Rather, the scope of the present invention is to be determined from the claims which follow.

What is claimed:

1. A method of forming a DRAM, comprising:

providing a substrate having a transfer transistor, the transfer transistor including a gate electrode having a protective layer formed on an upper surface and a sidewall of the gate electrode, a first source/drain region and a second source/drain region;

forming a first dielectric layer over the transistor;

forming a self-aligned contact via by etching the first dielectric layer while using the protective layer as a mask to protect the gate electrode, the self-aligned via exposing at least a portion of the first source/drain region and at least a portion of the protective layer formed on the upper surface of the gate electrode;

depositing a first conductive layer within the self-aligned contact via and over the protective layer, the first conductive layer being electrically connected with the first source/drain region;

providing a sacrificial layer over the first conductive layer;

patterning the sacrificial layer to form a sacrificial structure having sidewalls;

forming spacers on the sidewalls of the sacrificial structure;

removing the sacrificial structure; and etching, in a first anisotropic etching process, the first conductive layer using the spacers as a mask after the sacrificial structure is removed to form a vertically extending conductive structure electrically connected to the first source/drain region.

2. The method of claim 1, further comprising depositing a first dielectric layer over the transistor, wherein the forming the self-aligned contact via removes at least a portion of the first dielectric layer over the first source/drain region and at least a portion of the first dielectric layer over the protective layer, and wherein an etching rate of the protective layer is lower that an etching rate of the first dielectric layer.

3. The method of claim 2, further comprising etching the first conductive layer in a second etching process that stops on the first dielectric layer.

4. The method of claim 3, wherein a portion of the first dielectric layer is exposed in the second etching process that is immediately adjacent to a portion of the first dielectric layer that is not covered by a mask.

5. The method of claim 4, wherein the second etching process is anisotropic.

6. The method of claim 4, wherein the second etching process is substantially isotropic.

7. The method of claim 1, further comprising:

removing the spacers; and depositing a layer of hemispherical grained polysilicon in direct contact with surfaces of the vertically extending conductive structure subsequent to removing the spacers.

8. The method of claim 7, further comprising etching the layer of hemispherical grained polysilicon to expose at least a portion of the vertically extending conductive structure.

9. A method of forming a DRAM, comprising:

providing a substrate having a transfer transistor, the transfer transistor including a gate electrode having a protective layer formed thereon, a first source/drain region and a second source/drain region;

forming a self-aligned contact via while using the protective layer as a mask to protect the gate electrode, the self-aligned via exposing at least a portion of the first source/drain region and at least a portion of the protective layer;

depositing a first conductive layer within the self-aligned contact via and over the protective layer, the first conductive layer being electrically connected with the first source/drain region;

providing a sacrificial layer over the first conductive layer;

patterning the sacrificial layer to form a sacrificial structure having sidewalls;

forming spacers on the sidewalls of the sacrificial structure;

removing the sacrificial structure;

etching, in a first anisotropic etching process, the first conductive layer using the spacers as a mask after the sacrificial structure is removed to form a vertically extending conductive structure electrically connected to the first source/drain region;

removing the spacers;

depositing a layer of hemispherical grained polysilicon in direct contact with surfaces of the vertically extending conductive structure subsequent to removing the spacers; and etching the layer of hemispherical grained polysilicon to expose at least a portion of the vertically extending conductive structure, wherein the layer of hemispherical grained polysilicon is completely removed and a surface texture of the layer of hemispherical grained polysilicon is transferred to the vertically extending conductive structure.

10. The method of claim 2, further comprising etching the vertically extending conductive structure to provide a rougher surface texture on at least part of the vertically extending conductive structure.

11. The method of claim 10, wherein the vertically extending conductive structure has a tube shape.

12. The method of claim 11, wherein the vertically extending conductive structure has circular cross section.

13. The method of claim 10, wherein the etching the vertically extending conductive structure includes removing a sufficient portion of the first conductive layer to expose at least a portion of the first dielectric layer.

14. The method of claim 9, further comprising:

depositing a dielectric layer over the vertically extending conductive structure; and depositing a second conductive layer over the dielectric layer.

15. The method of claim 14, wherein the first conductive layer, the second conductive layer and the vertically extending conductive structure are polysilicon.

16. A method of forming a DRAM, comprising:

providing a substrate having a transfer transistor, the transfer transistor including a gate electrode having a protective layer formed thereon, a first source/drain region and a second source/drain region;

depositing a first dielectric layer over the transistor;

forming a self-aligned contact via through at least the first dielectric layer while using the protective layer as a mask to protect the gate electrode, the self-aligned via exposing at least a portion of the first source/drain region and at least a portion of the protective layer;

depositing a first conductive layer within the self-aligned contact via and over the protective layer, the first conductive layer being electrically connected to the first source/drain region;

providing a sacrificial layer over the first conductive layer;

patterning the sacrificial layer to form a sacrificial structure having sidewalls;

forming spacers on the sidewalls of the sacrificial structure;

removing the sacrificial structure;

anisotropically etching the first conductive layer using the spacers as a mask after the sacrificial structure is removed to form a vertically extending conductive structure electrically connected to the first source/drain region;

removing the spacers;

forming a hemispherical grained polysilicon layer over and in direct contact with the vertically extending conductive structure; and etching the hemispherical grained polysilicon layer to transfer a surface texture to the vertically extending conductive structure.

17. The method of claim 16, wherein etching the hemispherical grained polysilicon includes removing a sufficient portion of the first conductive layer to expose at least a portion of the first dielectric layer.

18. The method of claim 16, further comprising:
depositing a second dielectric layer over the vertically extending conductive structure; and
depositing a second conductive layer over the second dielectric layer.

19. The method of claim 18, wherein the first conductive layer, the second conductive layer and the vertically extending conductive structure are polysilicon.

* * * * *